United States Patent
Jang et al.

(10) Patent No.: US 8,323,522 B2
(45) Date of Patent: Dec. 4, 2012

(54) PLASMA REACTOR AND ETCHING METHOD USING THE SAME

(75) Inventors: Hyeokjin Jang, Suwon (KR); Minshik Kim, Suwon (KR); Kwangmin Lee, Suwon (KR); Sungyong Ko, Suwon (KR); Hwankook Chae, Suwon (KR); Kunjoo Park, Suwon (KR); Keehyun Kim, Suwon (KR); Weonmook Lee, Suwon (KR)

(73) Assignee: DMS Co., Ltd., Suwon Kyungki-Do (KR)

( * ) Notice: Subject to any disclaimer, the term of this patent is extended or adjusted under 35 U.S.C. 154(b) by 187 days.

(21) Appl. No.: 12/949,139

(22) Filed: Nov. 18, 2010

(65) Prior Publication Data
US 2011/0155694 A1  Jun. 30, 2011

(30) Foreign Application Priority Data
Dec. 24, 2009  (KR) ........................ 10-2009-0130381

(51) Int. Cl.
*G01L 21/30* (2006.01)
*B44C 1/22* (2006.01)
(52) U.S. Cl. .............. 216/61; 216/59; 216/67; 438/706; 438/710
(58) Field of Classification Search .................... 216/59, 216/61, 67; 438/706, 710
See application file for complete search history.

(56) References Cited

U.S. PATENT DOCUMENTS

| | | | | |
|---|---|---|---|---|
| 5,048,163 | A | * | 9/1991 | Asmus et al. ................ 29/25.01 |
| 6,054,013 | A | | 4/2000 | Collins et al. |
| 7,381,344 | B1 | * | 6/2008 | Chin et al. ..................... 216/67 |
| 2009/0156012 | A1 | * | 6/2009 | Hsieh et al. .................. 438/719 |
| 2010/0126667 | A1 | * | 5/2010 | Yin et al. ................. 156/345.43 |

FOREIGN PATENT DOCUMENTS

| KR | 1020010002501 | 1/2001 |
|---|---|---|
| KR | 1020080024693 | 3/2008 |
| KR | 10-2009-0036125 | 4/2009 |

* cited by examiner

*Primary Examiner* — Shamim Ahmed
(74) *Attorney, Agent, or Firm* — IPLA P.A.; James E. Bame

(57) ABSTRACT

A plasma reactor and an etching method using the same are provided. The method includes a first changing step of changing the number or arrangement structure of inductive coils connecting to an RF source power supply unit, a step of applying RF source power and generating high density plasma, a first etching step of etching a first etch-target layer of a workpiece, a first stopping step of stopping applying the RF source power, a second changing step of changing the number or arrangement structure of the inductive coils, a step of applying RF source power to corresponding inductive coils and generating low density plasma, a second etching step of etching a second etch-target layer of the workpiece, and a second stopping step of stopping applying the RF source power.

8 Claims, 10 Drawing Sheets

PLASMA REACTOR AND ETCHING METHOD USING THE SAME

CROSS REFERENCE

This application claims foreign priority under Paris Convention and 35 U.S.C. §119 to Korean Patent Application No. 10-2009-0130381, filed Dec. 24, 2009 with the Korean Intellectual Property Office.

BACKGROUND OF THE INVENTION

1. Field of the Invention

The present invention relates to a plasma reactor used in a semiconductor fabrication process. More particularly, the present invention relates to an Inductive Coupled Plasma (ICP) type plasma reactor and an etching method using the same.

2. Description of the Related Art

In recent years, as a Critical Dimension (CD) of a workpiece pattern obtained from etching is reduced to 50 nm or less in an etching process of a plasma reactor, a thickness of a photoresist layer used as an etch mask of a workpiece gets thinner. This makes it very difficult for a very thin photoresist pattern to sufficiently protect a region of a workpiece not to etch from plasma in the etching process for obtaining a pattern of a high aspect ratio (i.e., a pattern of a large H/W ratio (H: Height of workpiece pattern obtained from etching and W: Width of workpiece pattern obtained from etching)). To solve this problem, used is a multi-stack structure etch mask having a hard mask layer inserted between the photoresist pattern and the workpiece.

Compared to the etching process carried out with only the photoresist pattern laminated on the workpiece, an etching process using the multi-stack structure etch mask is much more complex. For example, a case that the hard mask layer is an Amorphous Carbon Layer (ACL) and Bottom Anti-Reflection Coating (BARC) film, and the workpiece to be etched is an oxide film can be taken into consideration. In this case, etching the ACL or BARC film requires a chemical etching process by high density plasma including a large amount of reactive ions and radical particles. On the other hand, etching the oxide film having a strong bonding structure requires a physical etching process by low density plasma having high ion energy. In case that the oxide film is etched by the low density plasma having the high ion energy, a relatively high selectivity (i.e., a ratio of Etch Rate (ER) of hard mask layer to ER of oxide film) can be maintained.

In case that the multi-stack structure etch mask is used for etching the oxide film as above, an etching condition of the hard mask layer is different from an etching condition of the oxide film. Because of this, there is a need to change a plasma density within a reaction chamber in course of the etching process to continuously etch the hard mask layer and the oxide film by one plasma reactor. However, the conventional plasma reactor is difficult to freely change the plasma density in course of the etching process. Accordingly, there is a need for two plasma reactors each set to the etching conditions to etch the hard mask layer and the oxide film.

On the other hand, as a workpiece (e.g., a wafer or glass substrate) becomes larger to a diameter of 300 nm or more, there occurs a phenomenon in which ERs of a center part and edge part of the workpiece are given different from each other, or a CD of a pattern formed in the center part of the workpiece after the etching process and a CD of a pattern formed in the edge part are given different from each other. This phenomenon frequently occurs when a concentration of a reactive gas of the center part of the workpiece within the reactive chamber is different from a concentration of a reactive gas of the edge part or when a density of a pattern to be formed in the center part of the workpiece is different from a density of a pattern to be formed in the edge part of the workpiece. Also, due to the phenomenon in which the ERs of the center part and edge part of the workpiece are given differently from each other, it is very difficult to secure process uniformity when etching the workpiece having the multi-stack structure etch mask laminated thereon. That is, it is difficult to secure the uniform ER in the center part and edge part of the large workpiece.

SUMMARY OF THE INVENTION

An aspect of exemplary embodiments of the present invention is to address at least the problems and/or disadvantages and to provide at least the advantages described below. Accordingly, an aspect of exemplary embodiments of the present invention is to provide an etching method using a plasma reactor, for selectively switching ON or OFF a plurality of switches connected between a plurality of inductive coils and a Radio Frequency (RF) source power generator according to a set etching condition and selectively changing a combination structure of the plurality of inductive coils, thereby being capable of securing a process uniformity and continuously executing etching processes of different conditions.

Another aspect of exemplary embodiments of the present invention is to provide a plasma reactor, for selectively switching ON or OFF a plurality of switches connected between a plurality of inductive coils and an RF source power generator according to a set etching condition and selectively changing a combination structure of the plurality of inductive coils, thereby being capable of securing a process uniformity and continuously executing etching processes of different conditions.

According to one aspect of the present invention, an etching method using a plasma reactor is provided. The method includes a first changing step of, when a first etching condition is set, changing, by an inductive coil control unit, the number or arrangement structure of inductive coils connecting to an RF source power supply unit of an Inductive Coupled Plasma (ICP) source power unit on the basis of the first etching condition, a step of applying, by the RF source power supply unit, RF source power to corresponding inductive coils connecting to the RF source power supply unit and generating high density plasma within a reaction chamber, a first etching step of etching, by the high density plasma, a first etch-target layer of a workpiece mounted on a cathode assembly within the reaction chamber during a first set time, a first stopping step of stopping, by the RF source power supply unit, applying the RF source power to the corresponding inductive coils connecting to the RF source power supply unit after the first set time, a second changing step of, when a second etching condition is set, changing, by the inductive coil control unit, the number or arrangement structure of the inductive coils connecting to the RF source power supply unit on the basis of the second etching condition, a step of applying, by the RF source power supply unit, RF source power to corresponding inductive coils connecting to the RF source power supply unit and generating low density plasma within the reaction chamber, a second etching step of etching, by the low density plasma, a second etch-target layer of the workpiece during a second set time, and a second stopping step of stopping, by the RF source power supply unit, applying the RF source power to the corresponding inductive coils connecting to the RF source power supply unit after the second set time.

According to another aspect of the present invention, a plasma reactor is provided. The plasma reactor includes a reaction chamber, an ICP source power unit, and an RF bias power supply unit. The reaction chamber includes a body in which a cathode assembly is installed and whose top is opened, and a dielectric window for sealing the opened top of the body. The ICP source power unit induces an electric field within the dielectric window. The RF bias power supply unit supplies RF bias power to the cathode assembly. The ICP source power unit includes a plurality of inductive coils, an RF source power supply unit, and an inductive coil control unit. The plurality of inductive coils are arranged outside the dielectric window, generate a magnetic field when RF source power is supplied, and induce the electric field by the magnetic field. The RF source power supply unit generates the RF source power. The inductive coil control unit selectively connects part or all of the plurality of inductive coils to the RF source power supply unit according to a preset etching condition, and selectively changes the number or arrangement structure of inductive coils applying the RF source power thereto.

BRIEF DESCRIPTION OF THE DRAWINGS

The above and other objects, features and advantages of the present invention will become more apparent from the following detailed description when taken in conjunction with the accompanying drawings in which.

Throughout the drawings, the same drawing reference numerals will be understood to refer to the same elements, features and structures.

DETAILED DESCRIPTION OF THE INVENTION

Exemplary embodiments of the present invention will now be described in detail with reference to the annexed drawings. In the following description, a detailed description of known functions and configurations incorporated herein has been omitted for conciseness.

Figure 1:
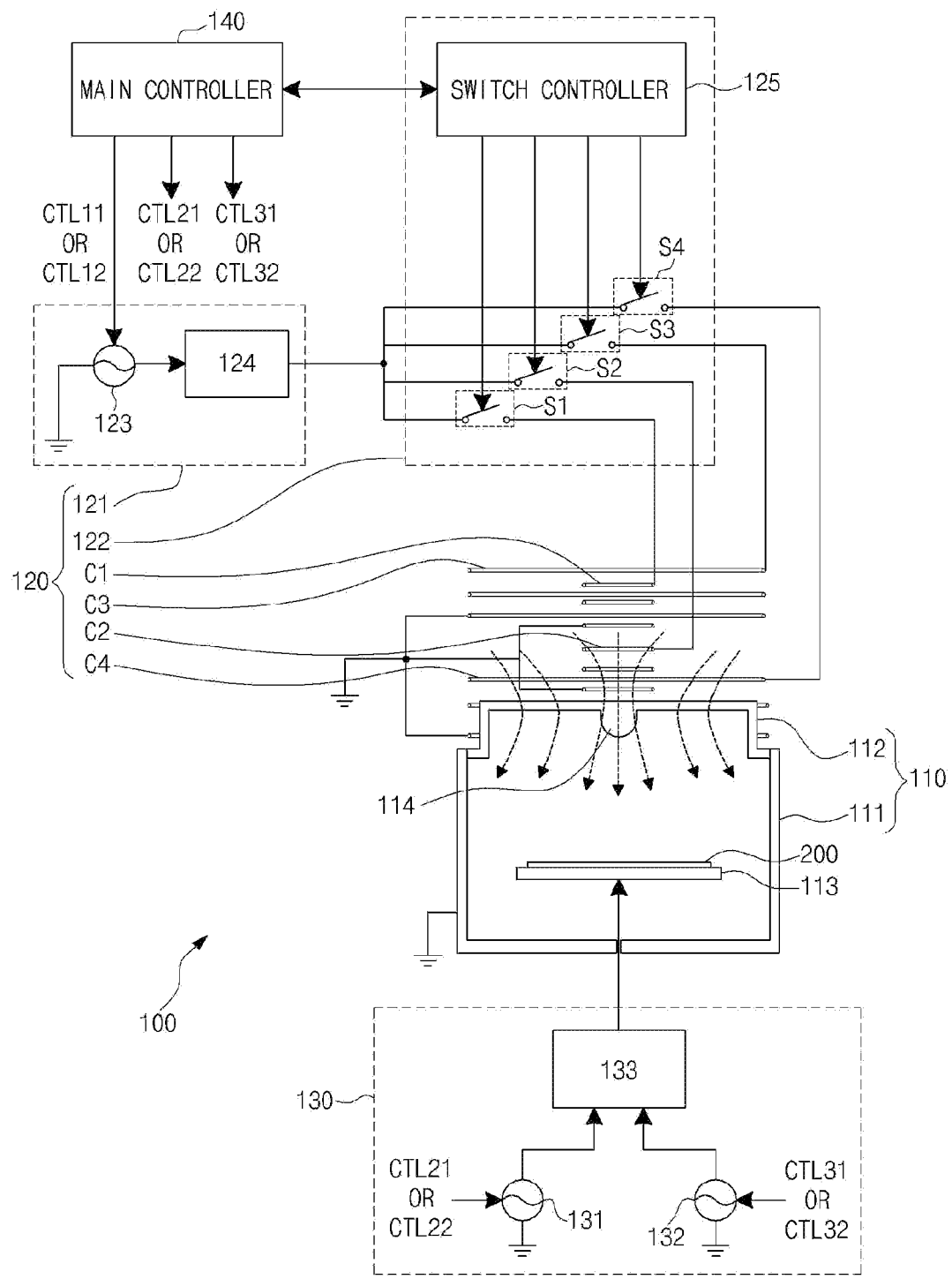
FIG. 1 is a schematic diagram illustrating a plasma reactor according to an exemplary embodiment of the present invention.

FIG. 1 is a schematic diagram illustrating a plasma reactor according to an exemplary embodiment of the present invention. For the simplicity of the drawings, FIG. 1 illustrates only parts related to the present invention. The plasma reactor 100 includes a reaction chamber 110, an Inductive Coupled Plasma (ICP) source power unit 120, and a Radio Frequency (RF) bias power supply unit 130.

The reaction chamber 110 includes a body 111 and a dielectric window 112. A cathode assembly 113 is installed within the body 111. The body 111 is opened at its top. The body 111 connects to the ground. The dielectric window 112 can be formed in a cylinder shape. The dielectric window 112 is installed to seal the opened top of the body 111. A gas injector 114 is installed at the dielectric window 112 and injects a reaction gas into the reaction chamber 110.

The ICP source power unit 120 induces an electric field inside the dielectric window 112. The ICP source power unit 120 includes a plurality of inductive coils (C1 to C4), an RF source power supply unit 121, and an inductive coil control unit 122.

The plurality of inductive coils (C1 to C4) are arranged outside the dielectric window 112, and generate a magnetic field when RF source power is supplied. By means of this magnetic field, the plurality of inductive coils (C1 to C4) induce an electric field inside the dielectric window 112.

The inductive coil (C1) and the inductive coil (C2) are spaced a set distance apart from each other and are arranged at a top and center of the outside of the dielectric window 112. The inductive coil (C3) has a greater diameter than the inductive coil (C1). The inductive coil (C3) is spaced a set distance apart from the inductive coil (C1) and is arranged outside the inductive coil (C1). The inductive coil (C4) has a great diameter than the inductive coil (C2). The inductive coil (C4) is spaced a set distance apart from the inductive coil (C2) and is arranged outside the inductive coil (C2).

FIG. 1 illustrates one example that the inductive coils (C1 to C4) are arranged outside the dielectric window 112, but the number and arrangement form of inductive coils arranged outside the dielectric window 112 can be variously changed according to need.

The RF source power supply unit 121 includes an RF source power generator 123, and an RF matcher 124 for impedance matching. The RF source power generator 123 generates RF source power in response to a source power control signal (CTL11) received from a main controller 140. Also, the RF source power generator 123 stops the generation of RF source power in response to a source power control signal (CTL12) received from the main controller 140.

By selectively connecting part or all of the plurality of inductive coils (C1 to C4) to the RF source power supply unit 121 according to a preset etching condition, the inductive coil control unit 122 selectively changes the number or arrangement structure of inductive coils applying RF source power thereto.

Figure 2:
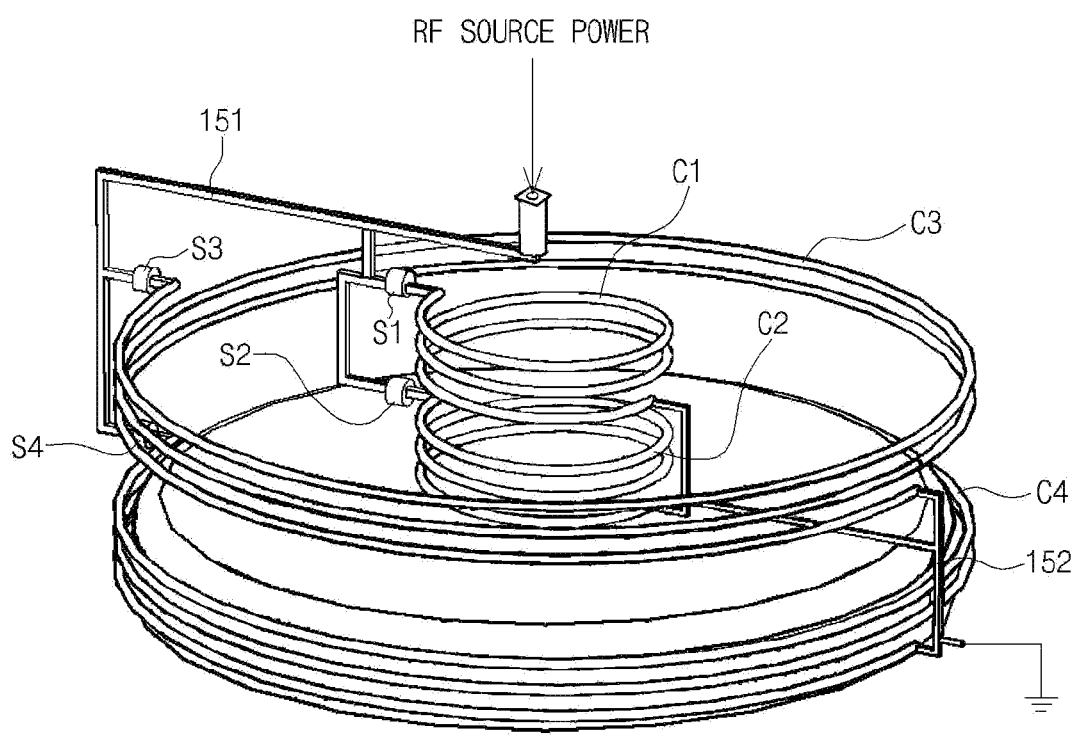
FIG. 2 is a diagram illustrating one example of a connection structure of a plurality of inductive coils and a plurality of switches illustrated in FIG. 1.

The inductive coil control unit 122 includes a plurality of switches (S1 to S4) and a switch controller 125. The plurality of switches (S1 to S4) each connect between the RF matcher 124 of the RF source power supply unit 121 and the plurality of inductive coils (C1 to C4). A connection structure of the plurality of switches (S1 to S4) and the plurality of inductive coils (C1 to C4) is, for example, described below with reference to FIG. 2. One end of each of the plurality of switches (S1 to S4) connects to a power line 151. The other end of each of the plurality of switches (S1 to S4) connects to one end of each of the plurality of inductive coils (C1 to C4). Also, the other end of each of the plurality of inductive coils (C1 to C4) connects to the ground through a power line 152.

Figure 3A:
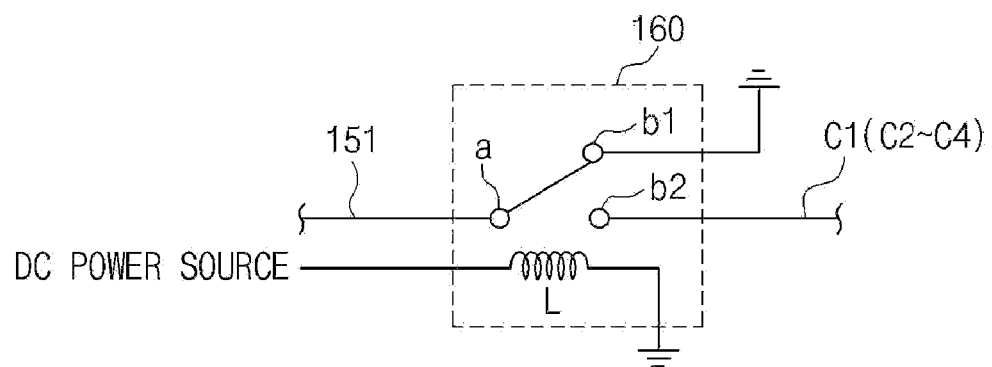
FIG. 3A is a diagram illustrating one example of a switch illustrated in FIG. 1.

As illustrated in FIG. 3A, each of the plurality of switches (S1 to S4) can be embodied as a relay switch 160 that is ON/OFF controlled by a Direct Current (DC) power source. In this case, the switch controller 125 supplies a DC power source to part or all of the plurality of switches (S1 to S4) according to a preset etching condition to selectively switch ON the part or all of the plurality of switches (S1 to S4).

The relay switch 160 includes contact points (a, b1, and b2), and a coil (L). The contact point (a) connects to the power line 151, the contact point (b1) connects to the ground, and the contact point (b2) connects to one of the inductive coils (C1 to C4). When an electric current does not flow in the coil (L), the relay switch 160 is switched OFF and, when the electric current flows in the coil (L) by the DC power source, the relay switch 160 is switched ON. When the relay switch 160 is switched OFF, the contact point (a) is kept as connecting to the contact point (b1). When the relay switch 160 is switch ON, the contact point (a) is kept as connecting to the contact point (b2).

Figure 3B:
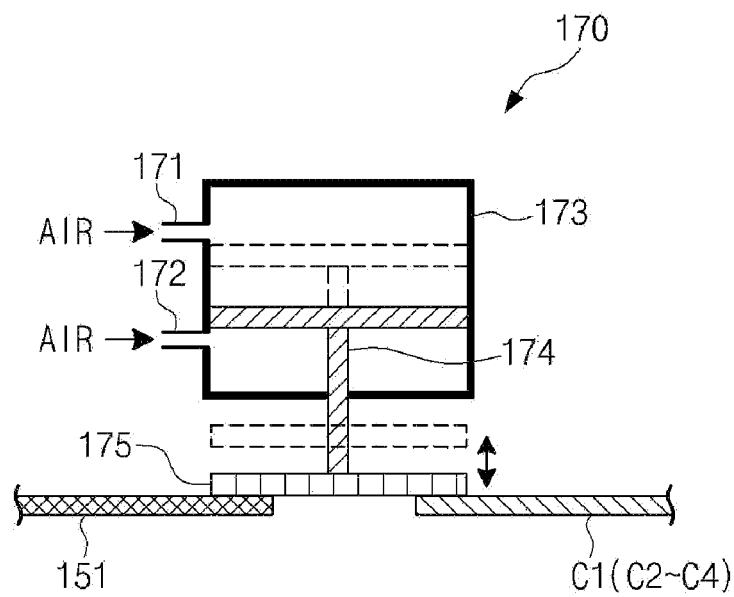
FIG. 3B is a diagram illustrating another example of a switch illustrated in FIG. 1.

As illustrated in FIG. 3B, each of the plurality of switches (S1 to S4) can be embodied as a pneumatic switch 170 that is ON/OFF controlled by a pressure of air. In this case, the switch controller 125 injects air into the part or all of the plurality of switches (S1 to S4) according to a preset etching condition to selectively switch ON the part or all of the plurality of switches (S1 to 54).

The pneumatic switch 170 includes a cylinder 173 including a first inlet 171 and a second inlet 172, a piston 174, and a conductive plate 175. The conductive plate 175 connects to one end of the piston 174. When air is injected into the cylinder 173 through the first inlet 171, the piston 174 moves to a bottom of the cylinder 173. In result, the conductive plate 175 connecting to the one end of the piston 174 connects to the power line 151 and one of the inductive coils (C1 to C4), thus electrically connecting the power line 151 with the one of the inductive coils (C1 to C4). On the other hand, when air is injected into the cylinder 173 through the second inlet 172, the piston 174 moves to a top of the cylinder 173. In result, the conductive plate 175 connecting to the one end of the piston 174 disconnects from the power line 151 and the one of the inductive coils (C1 to C4).

Referring again to FIG. 1, the RF bias power supply unit 130 supplies RF bias power to the cathode assembly 113 in response to bias power control signals (CTL21 and CTL31) received from the main controller 140. Also, the RF bias power supply unit 130 stops the supply of RF bias power to the cathode assembly 113 in response to bias power control signals (CTL22 and CTL32) received from the main controller 140.

The RF bias power supply unit 130 includes a low-frequency RF bias generator 131, a high-frequency RF bias generator 132, and a bias impedance RF matcher 133. The low-frequency RF bias generator 131 generates a low-frequency RF bias power in response to the bias power control signal (CTL21). The high-frequency RF bias generator 132 generates a high-frequency RF bias power in response to the bias power control signal (CTL31).

The bias impedance RF matcher 133 mixes the low-frequency RF bias power received from the low-frequency RF bias generator 131 with the high-frequency RF bias power received from the high-frequency RF bias generator 132, and supplies the mixed power to the cathode assembly 113.

FIG. 1 illustrate one example of the RF bias power supply unit 130 for mixing the low-frequency RF bias power with the high-frequency RF bias power and supplying the mixed power to the cathode assembly 113. The RF bias power supply unit 130 can variously change in construction and operation according to need.

On the other hand, the plasma reactor 100 can further include the main controller 140. The main controller 140 outputs the source power control signal (CTL11 or CTL 12) to the RF source power generator 123, and controls an operation of the RF source power generator 123. The main controller 140 outputs the bias power control signal (CTL21 or CTL22) to the low-frequency RF bias generator 131, and controls an operation of the low-frequency RF bias generator 131. The main controller 140 outputs the bias power control signal (CTL31 or CTL32) to the high-frequency RF bias generator 132, and controls an operation of the high-frequency RF bias generator 132. The main controller 140 can communicate with the switch controller 125, and recognize if an etching condition is set to the switch controller 125.

An etching process using the plasma reactor 100 is described below in detail with reference to FIG. 4.

A user can set an etching condition to the switch controller 125 using a user interface device (not shown) or can set a variety of kinds of data values, which are necessary for an operation of the plasma reactor 100, to the main controller 140.

The switch controller 125 judges if a first etching condition is set (step 1001). If the first etching condition is set, the switch controller 125 switches ON the part or all of the switches (S1 to S4) on the basis of the first etching condition and changes the number or arrangement structure of inductive coils connecting to the RF source power supply unit 121 (step 1002).

After that, the main controller 140 outputs a source power control signal (CTL11) to the RF source power generator 123 for the RF source power supply unit 121 to apply RF source power to corresponding inductive coils connecting to the RF source power supply unit 121 during a first set time. In result, high density plasma is generated within the reaction chamber 110 (step 1003).

During the first set time, a first etch-target layer (not shown) of a workpiece 200 mounted on the cathode assembly 113 within the reaction chamber 110 is etched by the high density plasma (step 1004).

After the first set time, the main controller 140 outputs a source power control signal (CTL12) to the RF source power generator 123. In result, the RF source power supply unit 121 stops applying RF source power to corresponding inductive coils connecting to the RF source power supply unit 121 (step 1005).

Here, the first etching condition can include first to third conditions (P1 to P3). The first condition (P1) is a condition for setting the number or arrangement structure of inductive coils to be connected to the RF source power supply unit 121, such that a plasma density of a center part of the first etch-target layer becomes identical with a plasma density of an edge part of the first etch-target layer.

Figure 5A:
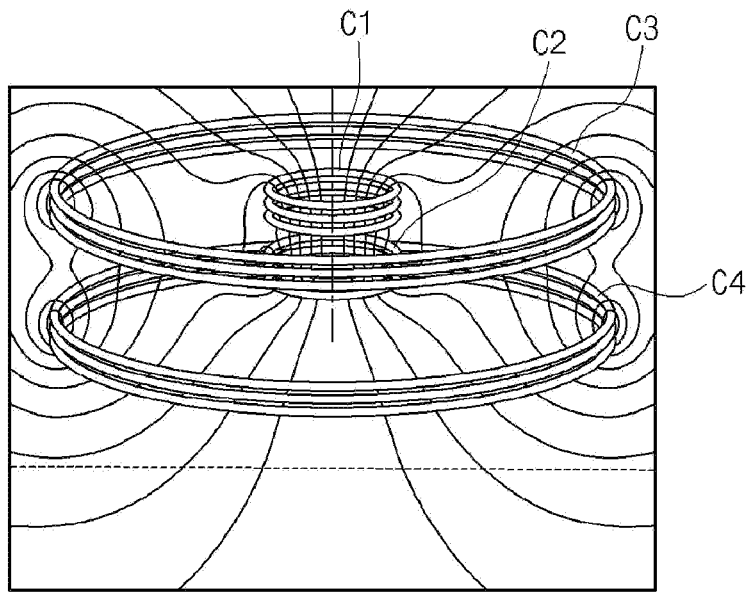
FIG. 5A is a diagram illustrating one example of an inductive coil arrangement structure for generating high density plasma in the plasma reactor illustrated in FIG. 1.

In case that the first condition (P1) is set to the switch controller 125, the arrangement structure of the inductive coils connecting to the RF source power supply unit 121 can be a form illustrated in FIG. 5A, for example. As illustrated in FIG. 5A, in case that RF source power is applied to all of the inductive coils (C1 to C4), a magnetic field is wholly uniformly formed around the inductive coils (C1 to C4).

In an experimental process, in case that it is proved that Etch Rates (ERs) of the center part and edge part of the first etch-target layer are the same as each other or CDs of patterns of the center part and edge part of the first etch-target layer are the same as each other, the first condition (P1) can be set to the switch controller 125 as the first etching condition for an actual etching process.

The second condition (P2) is a condition for setting the number or arrangement structure of inductive coils to be connected to the RF source power supply unit 121, such that the plasma density of the center part of the first etch-target layer becomes greater than the plasma density of the edge part of the first etch-target layer.

Figure 5B:
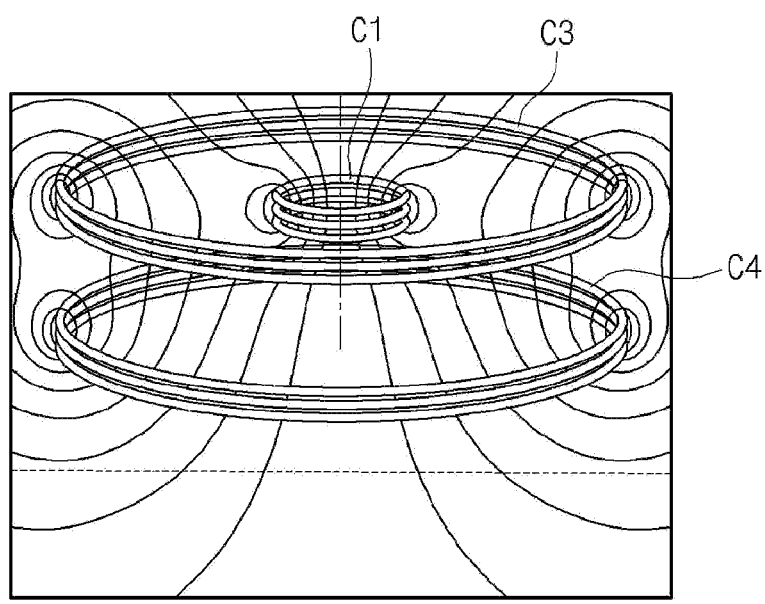
FIG. 5B is a diagram illustrating another example of an inductive coil arrangement structure for generating high density plasma in the plasma reactor illustrated in FIG. 1.

In case that the second condition (P2) is set to the switch controller 125, the arrangement structure of the inductive coils connecting to the RF source power supply unit 121 can be a form illustrated in FIG. 5B, for example. As illustrated in FIG. 5B, in case that RF source power is applied to the inductive coils (C1, C3, and C4), a magnetic field is formed biased toward the inductive coils (C3 and C4).

In an experimental process, in case that it is proved that an ER or a CD of a pattern of the center part of the first etch-target layer is greater than an ER or a CD of a pattern of the edge part of the first etch-target layer, the second condition (P2) can be set to the switch controller 125 as the first etching condition for an actual etching process. In result, the ER of the edge part of the first etch-target layer increases more than the ER of the center part of the first etch-target layer, so the uniformity of the whole etching process is secured. That is, the ER or the CD of the pattern of the center part of the first etch-target layer is given identical with the ER or the CD of the pattern of the edge part of the first etch-target layer.

The third condition (P3) is a condition for setting the number or arrangement structure of inductive coils to be connected to the RF source power supply unit 121, such that the plasma density of the edge part of the first etch-target layer becomes greater than the plasma density of the center part of the first etch-target layer.

Figure 5C:
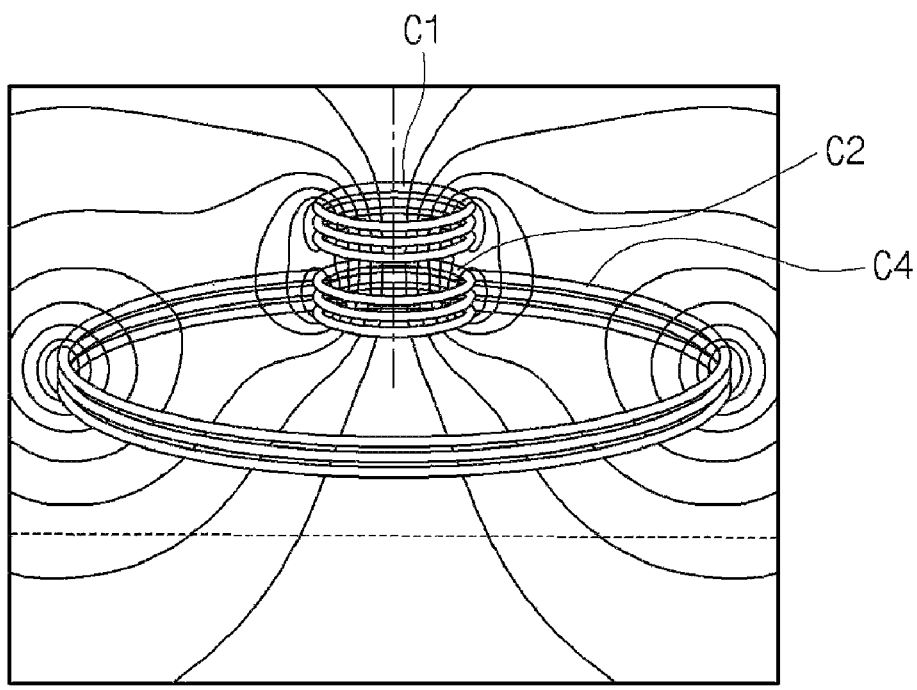
FIG. 5C is a diagram illustrating a further example of an inductive coil arrangement structure for generating high density plasma in the plasma reactor illustrated in FIG. 1.

In case that the third condition (P3) is set to the switch controller 125, the arrangement structure of the inductive coils connecting to the RF source power supply unit 121 can be a form illustrated in FIG. 5C, for example. As illustrated in FIG. 5C, in case that RF source power is applied to the inductive coils (C1, C2, and C4), a magnetic field is formed biased toward the inductive coils (C1 and C2).

In an experimental process, in case that it is proved that the ER or the CD of the pattern of the edge part of the first etch-target layer is greater than the ER or the CD of the pattern of the center part of the first etch-target layer, the third condition (P3) can be set to the switch controller 125 as the first etching condition for an actual etching process. In result, the ER of the center part of the first etch-target layer increases more than the ER of the edge part of the first etch-target layer, so the uniformity of the whole etching process is secured. That is, the ER or the CD of the pattern of the center part of the first etch-target layer is given identical with the ER or the CD of the pattern of the edge part of the first etch-target layer.

The switch controller 125 judges if a second etching condition is set (step 1006). If the second etching condition is set or if it is judged that the first etching condition is not set, the switch controller 125 switches ON part of the switches (S1 to S4) on the basis of the second etching condition and changes the number or arrangement structure of inductive coils connecting to the RF source power supply unit 121 (step 1007).

After that, the main controller 140 outputs a source power control signal (CTL11) to the RF source power generator 123 for the RF source power supply unit 121 to apply RF source power to corresponding inductive coils connecting to the RF source power supply unit 121 during a second set time. In result, low density plasma is generated within the reaction chamber 110 (step 1008).

During the second set time, a second etch-target layer (not shown) of the workpiece 200 mounted on the cathode assembly 113 within the reaction chamber 110 is etched by the low density plasma (step 1009).

After the second set time, the main controller 140 outputs a source power control signal (CTL12) to the RF source power generator 123. In result, the RF source power supply unit 121 stops applying RF source power to corresponding inductive coils connecting to the RF source power supply unit 121 (step 1010).

Here, the second etching condition can include first to third conditions (Q1 to Q3). The first condition (Q1) is a condition for setting the number or arrangement structure of inductive coils to be connected to the RF source power supply unit 121, such that a plasma density of a center part of the second etch-target layer becomes identical with a plasma density of an edge part of the second etch-target layer.

Figure 6A:
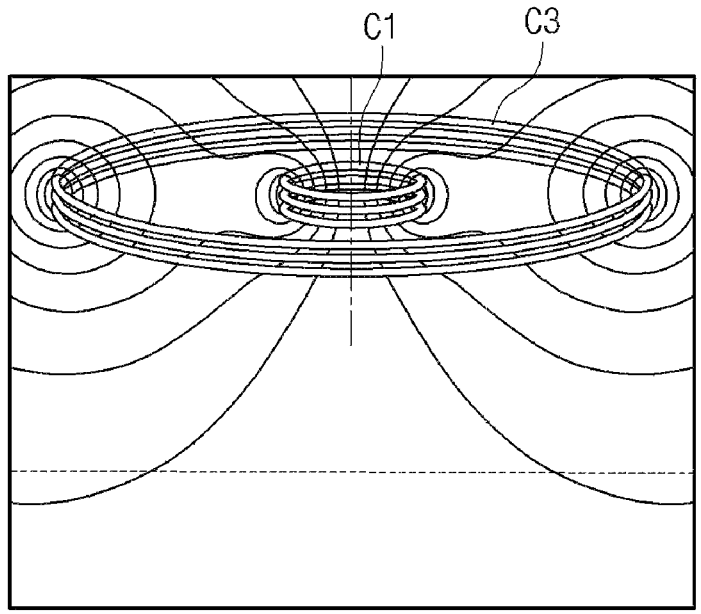
FIG. 6A is a diagram illustrating one example of an inductive coil arrangement structure for generating low density plasma in the plasma reactor illustrated in FIG. 1.

In case that the first condition (Q1) is set to the switch controller 125, the arrangement structure of the inductive coils connecting to the RF source power supply unit 121 can be a form illustrated in FIG. 6A, for example. It is identified that the strength of a magnetic field generated when RF source power is applied to the inductive coils (C1 and C3) as illustrated in FIG. 6A is less than the strength of a magnetic field generated when RF source power is applied to all of the inductive coils (C1 to C4) (referring to FIG. 5). The reason why the magnetic field decreases is that the RF source power is applied only to the inductive coils (C1 and C3) arranged at a long distance from the dielectric window 112.

Figure 8A:
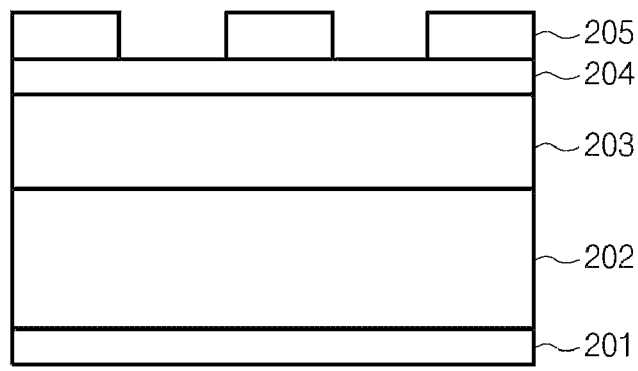
FIGS. 8A to 8C are cross sections illustrating a workpiece etched in the etching process of FIG. 7.
Figure 8B:
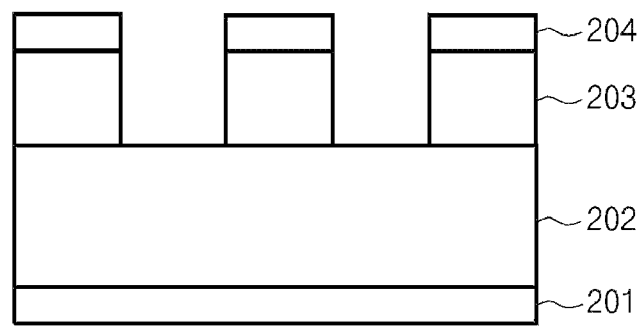
Figure 8C:
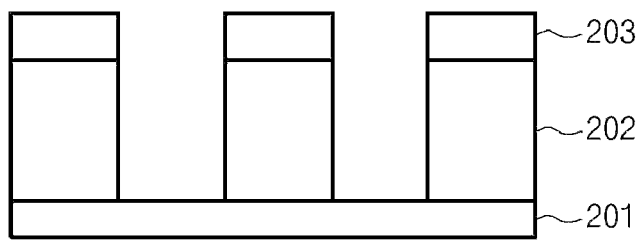

For the sake of increasing a selectivity of material needing physical etch such as an oxide file 202 of FIG. 8A, an etching process is advantageously executed in a state in which RF source power is not applied to the inductive coils (C1 to C4) and RF bias power is applied only to the cathode assembly 113. That is because the RF source power can cause an excessive decomposition of a molecule of reaction gas because the RF source power has a high electronic temperature compared to the RF bias power.

At a low pressure (e.g., 30 mTorr or less), in case that the RF source power is not applied to the inductive coils (C1 to C4) and the RF bias power is applied only to the cathode assembly 113, plasma ignition is difficult. On the other hand, in a state in which the RF source power is applied to the whole inductive coils (C1 to C4), a decrease of the strength of a magnetic field requires a decrease of the strength of the RF source power generated by the RF source power supply unit 121. However, because there is a limitation in decreasing the strength of the RF source power generated by the RF source power supply unit 121, by decreasing the number of the inductive coils applying the RF source power thereto, the strength of the magnetic field can decrease to a range capable of generating optimum low-density plasma. In result, the strength of the magnetic field induced by the inductive coils can be freely controlled suitable to a characteristic of an etching object and thus, a range of a process window can extend a little more.

When RF source power is applied to the inductive coils (C1 and C3), a magnetic field is wholly uniformly formed around the inductive coils (C1 and C3). In an experimental process, in case that it is proved that ERs of the center part and edge part of the second etch-target layer are the same as each other or CDs of patterns of the center part and edge part of the second etch-target layer are the same as each other, the first condition (Q1) can be set to the switch controller 125 as the second etching condition for an actual etching process.

The second condition (Q2) is a condition for setting the number or arrangement structure of inductive coils to be connected to the RF source power supply unit 121, such that the plasma density of the center part of the second etch-target layer becomes greater than the plasma density of the edge part of the second etch-target layer.

Figure 6B:
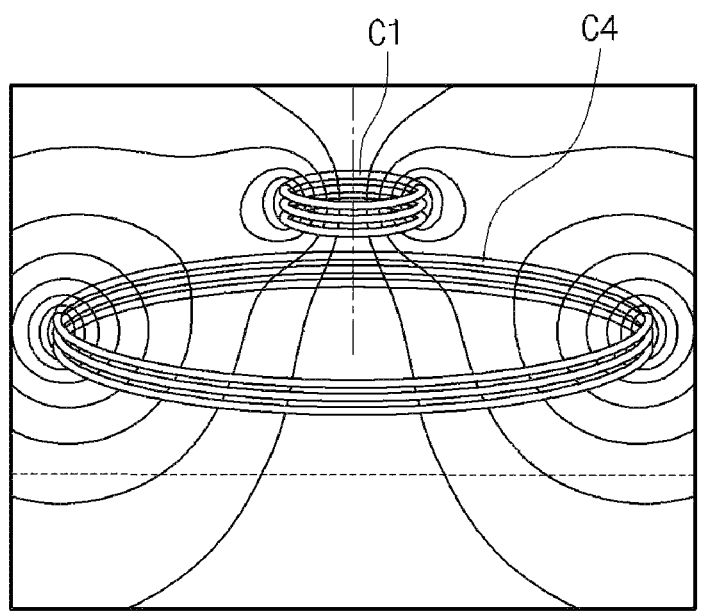
FIG. 6B is a diagram illustrating another example of an inductive coil arrangement structure for generating low density plasma in the plasma reactor illustrated in FIG. 1.

In case that the second condition (Q2) is set to the switch controller 125, the arrangement structure of the inductive coils connecting to the RF source power supply unit 121 can be a form illustrated in FIG. 6B, for example. As illustrated in FIG. 6B, in case that RF source power is applied to the inductive coils (C1 and C4), a magnetic field is formed biased toward the inductive coil (C4).

In an experimental process, in case that it is proved that an ER or a CD of a pattern of the center part of the second etch-target layer is greater than an ER or a CD of a pattern of the edge part of the second etch-target layer, the second condition (Q2) can be set to the switch controller 125 as the second etching condition for an actual etching process. In result, the ER of the edge part of the second etch-target layer increases more than the ER of the center part of the second etch-target layer, so the uniformity of the whole etching process is secured. That is, the ER or the CD of the pattern of the center part of the second etch-target layer is given identical with the ER or the CD of the pattern of the edge part of the second etch-target layer.

The third condition (Q3) is a condition for setting the number or arrangement structure of inductive coils to be connected to the RF source power supply unit 121, such that the plasma density of the edge part of the second etch-target layer becomes greater than the plasma density of the center part of the second etch-target layer.

Figure 6C:
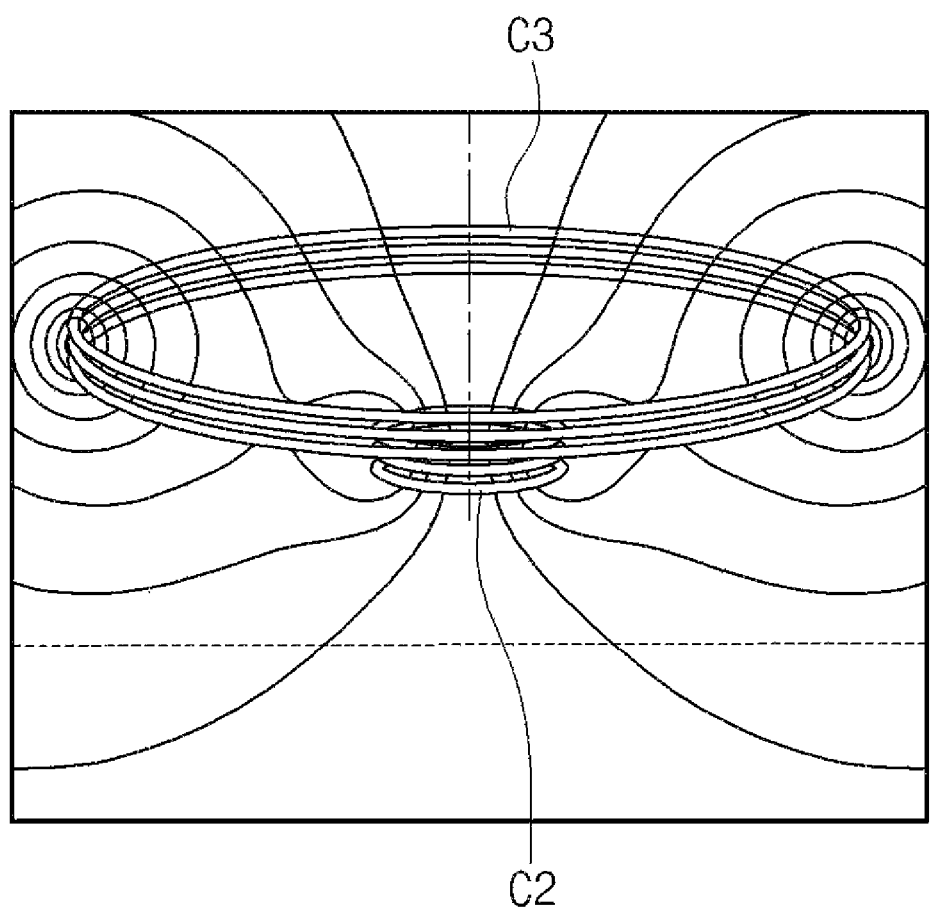
FIG. 6C is a diagram illustrating a further example of an inductive coil arrangement structure for generating low density plasma in the plasma reactor illustrated in FIG. 1.

In case that the third condition (Q3) is set to the switch controller 125, the arrangement structure of the inductive coils connecting to the RF source power supply unit 121 can be a form illustrated in FIG. 6C, for example. As illustrated in FIG. 6C, in case that RF source power is applied to the inductive coils (C2 and C3), a magnetic field is formed biased toward the inductive coil (C2).

In an experimental process, in case that it is proved that the ER or the CD of the pattern of the edge part of the second etch-target layer is greater than the ER or the CD of the pattern of the center part of the second etch-target layer, the third condition (Q3) can be set to the switch controller 125 as the second etching condition for an actual etching process. In result, the ER of the center part of the second etch-target layer increases more than the ER of the edge part of the second etch-target layer, so the uniformity of the whole etching process is secured. That is, the ER or the CD of the pattern of the center part of the second etch-target layer is given identical with the ER or the CD of the pattern of the edge part of the second etch-target layer.

Figure 4:
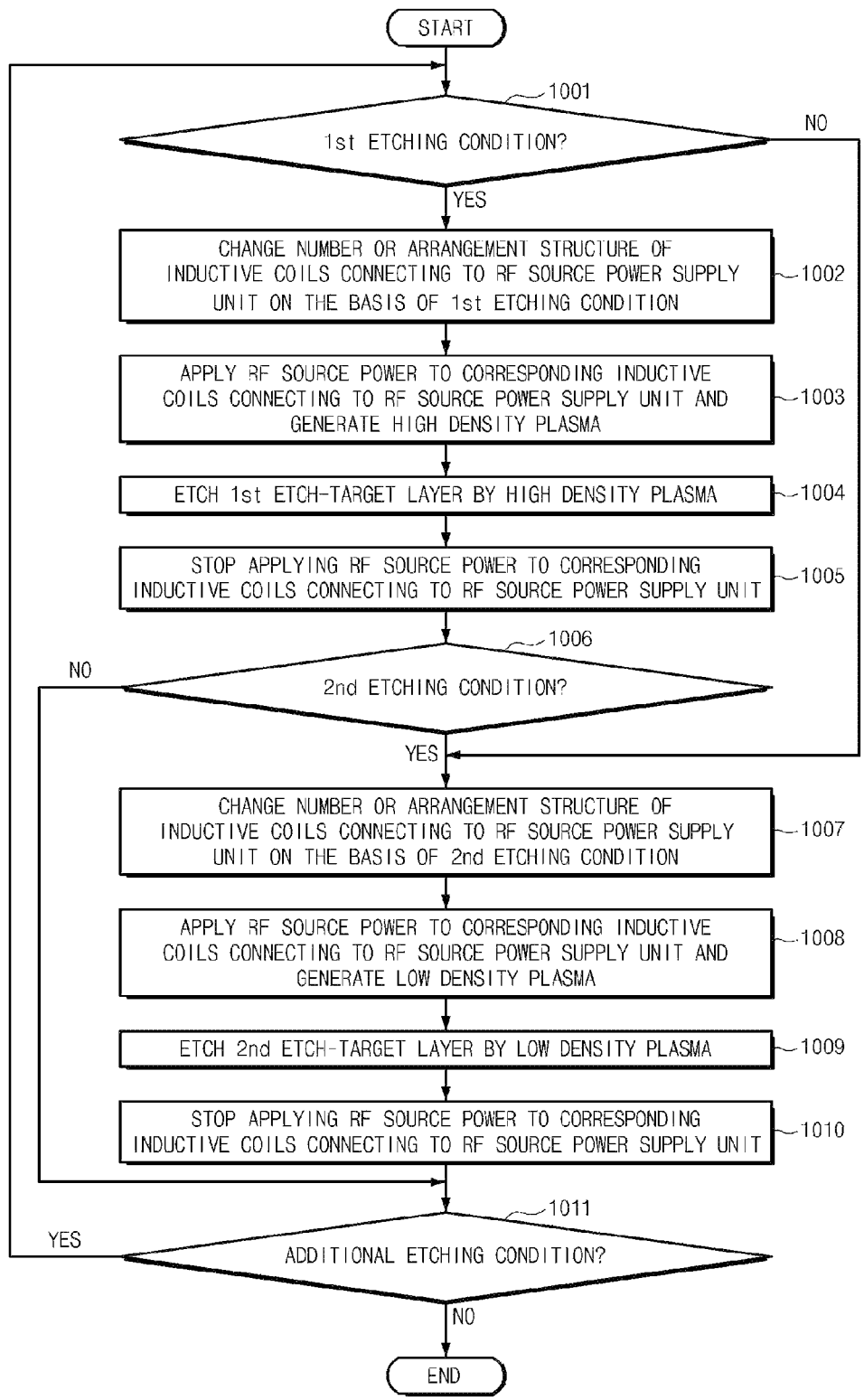
FIG. 4 is a flow diagram illustrating an etching process using the plasma reactor illustrated in FIG. 1.

FIG. 4 illustrates one example that the plasma reactor 100 executes the operation of step 1006 to step 1010 after executing the operation of step 1001 to step 1005. Unlike this, the plasma reactor 100 may execute the operation of step 1001 to step 1005 after executing the operation of step 1006 to step 1010. In this case, the second etch-target layer is positioned at a top of the first etch-target layer. Also, in case that the plasma reactor 100 executes the operation of step 1006 to step 1010 after executing the operation of step 1001 to step 1005, the first etch-target layer is positioned at a top of the second etch-target layer.

Also, although not illustrated in FIG. 4, while the plasma reactor 100 executes the operation of step 1004 or step 1009, RF bias power can be supplied to the cathode assembly 113 by the RF bias power supply unit 130. For this, the main controller 140 outputs bias power control signals (CTL21 and CTL31) to the RF bias power supply unit 130. After that, in step 1005 or step 1010, the main controller 140 outputs bias power control signals (CTL22 and CTL32) to the RF bias power supply unit 130.

After step 1010 or if it is proved that the second etching condition is not set in step 1006, the switch controller 125 judges if an additional etching condition is set (step 1011). If the additional etching condition is not set to the switch controller 125, the plasma reactor 100 terminates the etching process.

If the additional etching condition is set to the switch controller 125, the plasma reactor 100 repeats the operation of step 1001 to step 1005, or step 1006 to step 1010.

Figure 7:
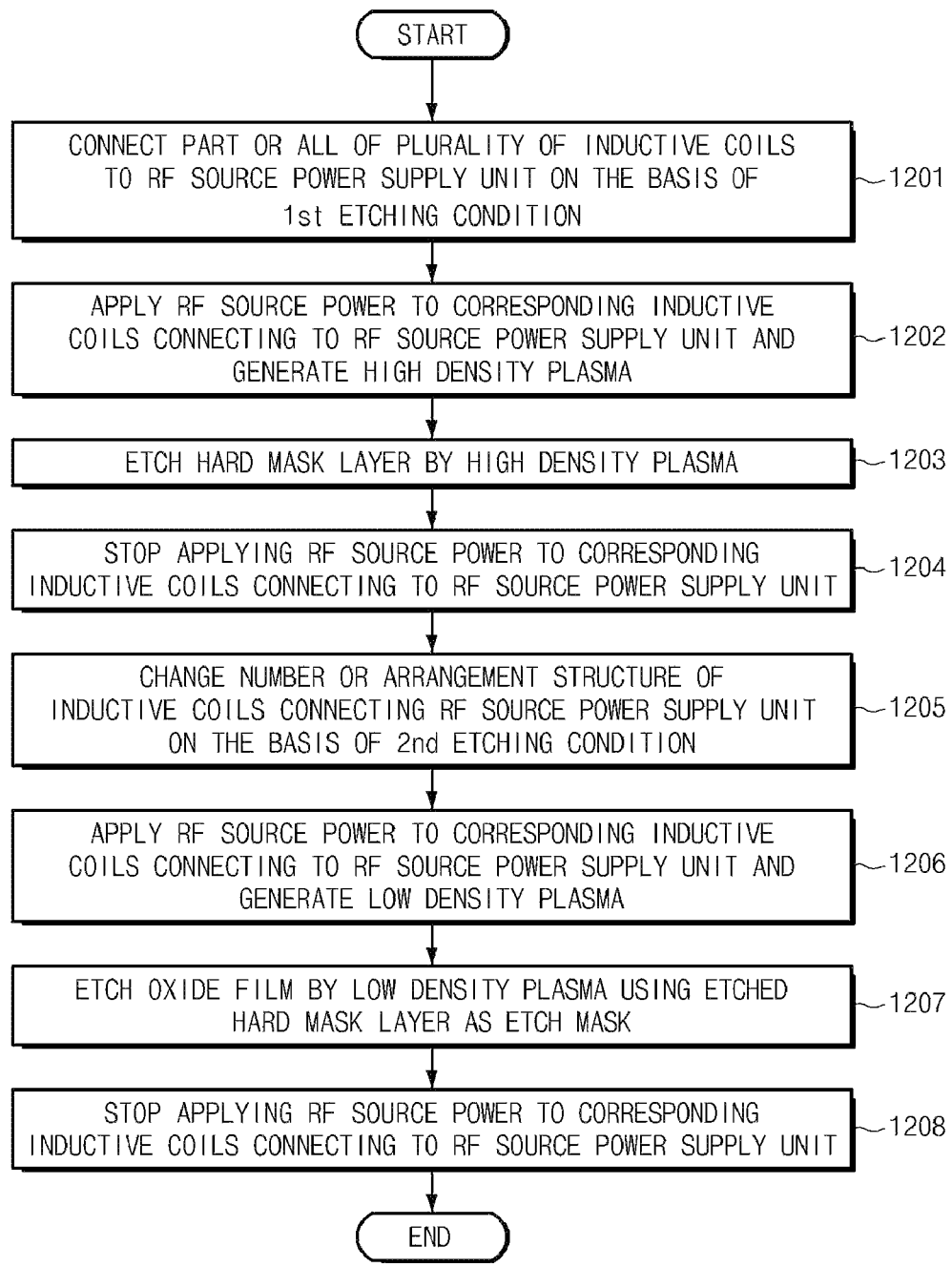
FIG. 7 is a flow diagram illustrating one example of an etching process using the plasma reactor illustrated in FIG. 1.

FIG. 7 is a flow diagram illustrating one example of an etching process using the plasma reactor illustrated in FIG. 1. FIG. 7 shows a process of etching a workpiece including a Silicon Nitride (SiN) layer 201, an oxide film 202, an ACL 203, a BARC or Silicon Oxynitride (SiON) layer 204, and a photoresist pattern 205 as illustrated in FIG. 8A. The ACL 203 and the BARC 204 are used as a hard mask layer.

On the basis of a preset first etching condition, the switch controller 125 switches ON part or all of the switches (S1 to S4) and connects part or all of the inductive coils (C1 to C4) to the RF source power supply unit 121 (step 1201).

After that, for the RF source power supply unit 121 to apply RF source power to corresponding inductive coils connecting to the RF source power supply unit 121 during a first set time, the main controller 140 outputs a source power control signal (CTL11) to the RF source power generator 123. In result, high density plasma is generated within the reaction chamber 110 (step 1202).

During the first set time, the hard mask layers 204 and 203 of the workpiece 200 mounted on the cathode assembly 113 within the reaction chamber 110 are etched by the high density plasma using the photoresist pattern 205 as an etching mask (step 1203).

After the first set time, the main controller 140 outputs a source power control signal (CTL12) to the RF source power generator 123 and, in result, the RF source power supply unit 121 stops applying RF source power to corresponding inductive coils connected to the RF source power supply unit 121 (step 1204).

On the basis of a second etching condition, the switch controller 125 switches ON part of the switches (S1 to S4) and changes the number or arrangement structure of inductive coils connecting to the RF source power supply unit 121 (step 1205).

After that, for the RF source power supply unit 121 to apply RF source power to corresponding inductive coils connecting to the RF source power supply unit 121 during a second set time, the main controller 140 outputs a source power control signal (CTL11) to the RF source power generator 123. In result, low density plasma is generated within the reaction chamber 110 (step 1206).

During the second set time, the oxide film 202 is etched by the low density plasma using the etched hard mask layers 204 and 203 of step 1203 as an etching mask (step 1207).

After the second set time, the main controller 140 outputs a source power control signal (CTL12) to the RF source power generator 123 and, in result, the RF source power supply unit 121 stops applying RF source power to corresponding inductive coils connected to the RF source power supply unit 121 (step 1208).

Although not illustrated in FIG. 7, while the plasma reactor 100 executes the operation of step 1203 or step 1207, RF bias power can be supplied to the cathode assembly 113 by the RF bias power supply unit 130.

As described above, a plasma reactor and an etching method using the same according to the present invention selectively switch ON or OFF a plurality of switches connecting to a plurality of inductive coils and an RF source power generator according to a set etching condition and selectively changes a combination structure of the plurality of inductive coils, thus being capable of securing a process uniformity and continuously executing etching processes of different conditions within one reaction chamber.

Also, by means of a suitable combination of a high-density plasma etching process and a low-density plasma etching process, the plasma reactor and the workpiece etching method using the same according to the present invention can execute an etching process capable of obtaining the optimum selectivity, the optimum pattern CD, and the optimum etch profile by etch-target layer of a workpiece of a multi-stack film structure, within one reaction chamber.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An etching method using a plasma reactor, the method comprising:
    a first changing step of, when a first etching condition is set, changing, by an inductive coil control unit, the number or arrangement structure of inductive coils connecting to a Radio Frequency (RF) source power supply unit of an Inductive Coupled Plasma (ICP) source power unit on the basis of the first etching condition;
    a step of applying, by the RF source power supply unit, RF source power to corresponding inductive coils connecting to the RF source power supply unit and generating high density plasma within a reaction chamber;
    a first etching step of etching, by the high density plasma, a first etch-target layer of a workpiece mounted on a cathode assembly within the reaction chamber during a first set time;
    a first stopping step of stopping, by the RF source power supply unit, applying the RF source power to the corresponding inductive coils connecting to the RF source power supply unit after the first set time;
    a second changing step of, when a second etching condition is set, changing, by the inductive coil control unit, the number or arrangement structure of the inductive coils connecting to the RF source power supply unit on the basis of the second etching condition;
    a step of applying, by the RF source power supply unit, RF source power to corresponding inductive coils connecting to the RF source power supply unit and generating low density plasma within the reaction chamber;
    a second etching step of etching, by the low density plasma, a second etch-target layer of the workpiece during a second set time; and
    a second stopping step of stopping, by the RF source power supply unit, applying the RF source power to the corresponding inductive coils connecting to the RF source power supply unit after the second set time.

2. The method of claim 1, further comprising supplying RF bias power to the cathode assembly while the first etching step or the second etching step is executed.

3. The method of claim 1, further comprising a repeating step of, when an additional etching condition is set, repeating the first changing step to the first stopping step or repeating the second changing step or the second stopping step, according to the set etching condition.

4. The method of claim 1, wherein, after the second changing step to the second stopping step are executed, the first changing step to the first stopping step are executed, and
    wherein the second etch-target layer is positioned at a top of the first etch-target layer.

5. The method of claim 1, wherein the first etching condition is any one of a first condition for setting the number or arrangement structure of inductive coils to be connected to the RF source power supply unit such that a plasma density of a center part of the first etch-target layer becomes identical with a plasma density of an edge part of the first etch-target layer, a second condition for setting the number or arrangement structure of the inductive coils to be connected to the RF power source supply unit such that the plasma density of the center part of the first etch-target layer becomes greater than the plasma density of the edge part of the first etch-target layer, and a third condition for setting the number or arrangement structure of the inductive coils to be connected to the RF source power supply unit such that the plasma density of the edge part of the first etch-target layer becomes greater than the plasma density of the center part of the first etch-target layer.

6. The method of claim 5, wherein, while the first etching step is executed, an Etch Rate (ER) or a Critical Dimension (CD) of a pattern of the center part of the first etch-target layer is identical with an ER or a CD of a pattern of the edge part of the first etch-target layer.

7. The method of claim 1, wherein the second etching condition is any one of a first condition for setting the number or arrangement structure of inductive coils to be connected to the RF source power supply unit such that a plasma density of a center part of the second etch-target layer becomes identical with a plasma density of an edge part of the second etch-target layer, a second condition for setting the number or arrangement structure of the inductive coils to be connected to the RF power source supply unit such that the plasma density of the center part of the second etch-target layer becomes greater than the plasma density of the edge part of the second etch-target layer, and a third condition for setting the number or arrangement structure of the inductive coils to be connected to the RF source power supply unit such that the plasma density of the edge part of the second etch-target layer becomes greater than the plasma density of the center part of the second etch-target layer.

8. The method of claim 7, wherein, while the second etching step is executed, an ER or a CD of a pattern of the center part of the second etch-target layer is identical with an ER or a CD of a pattern of the edge part of the second etch-target layer.

* * * * *